(12) United States Patent
Lüttringhaus-Henkel et al.

(10) Patent No.: US 6,958,097 B2
(45) Date of Patent: Oct. 25, 2005

(54) DEVICE FOR HOLDING AND VACUUM-SEALING A CONTAINER HAVING AN OPENING

(75) Inventors: Andreas Lüttringhaus-Henkel, Darmstadt (DE); Matthias Bicker, Mainz (DE); Stephan Behle, Hahnheim (DE); Gregor Arnold, Bodenheim (DE)

(73) Assignee: Schott Glas, Mainz (DE)

( * ) Notice: Subject to any disclaimer, the term of this patent is extended or adjusted under 35 U.S.C. 154(b) by 79 days.

(21) Appl. No.: 10/439,090

(22) Filed: May 14, 2003

(65) Prior Publication Data

US 2003/0217527 A1 Nov. 27, 2003

(30) Foreign Application Priority Data

May 15, 2002 (DE) ......................................... 102 21 461

(51) Int. Cl.⁷ ......................... C23C 16/00; C23C 16/458
(52) U.S. Cl. ....................... 118/503; 118/715; 118/728; 118/733; 118/500
(58) Field of Search ................................ 118/715, 728, 118/733, 500, 503; 53/97

(56) References Cited

U.S. PATENT DOCUMENTS

| | | | | |
|---|---|---|---|---|
| 4,099,486 A | * | 7/1978 | Bialorucki et al. | ......... 118/635 |
| 6,132,562 A | * | 10/2000 | Baumecker et al. | ... 204/192.12 |
| 6,503,328 B1 | * | 1/2003 | Buschmeier et al. | ........ 118/426 |
| 6,526,998 B2 | * | 3/2003 | Abe | ......................... 134/22.18 |
| 6,758,907 B2 | * | 7/2004 | Kampmann | ................. 118/503 |
| 2003/0217527 A1 | * | 11/2003 | Luttringhaus-Henkel et al. | ................................................................... 53/79 |

FOREIGN PATENT DOCUMENTS

| | | | | |
|---|---|---|---|---|
| DE | 196 49 750 A1 | 4/1998 | ........... B29C/49/42 |
| DE | 198 02 333 A1 | 7/1999 | ........... C23C/16/50 |
| WO | PCT/WO99/17334 | 8/1999 | ............ H01J/37/32 |

* cited by examiner

*Primary Examiner*—Jeffrei R. Lund

(57) ABSTRACT

A device for holding and vacuum-sealing a container as used in particular in the internal and/or external coating of containers. The device holds and vacuum-seals at least one container and has a sealing device for sealing the pouring opening in a defined end state also to comprise a holder with an introduction region, into which the wall region, which adjoins the pouring opening, together with the pouring opening, can be at least partially introduced, and a cage, which interacts with the holder and holds at least one clamping element in such a manner that, when force is applied to the cage in the direction in which the container is introduced into the defined end state, the clamping element can be guided out of a position in which it substantially releases the introduction region into a position in which it projects into the introduction region.

16 Claims, 2 Drawing Sheets

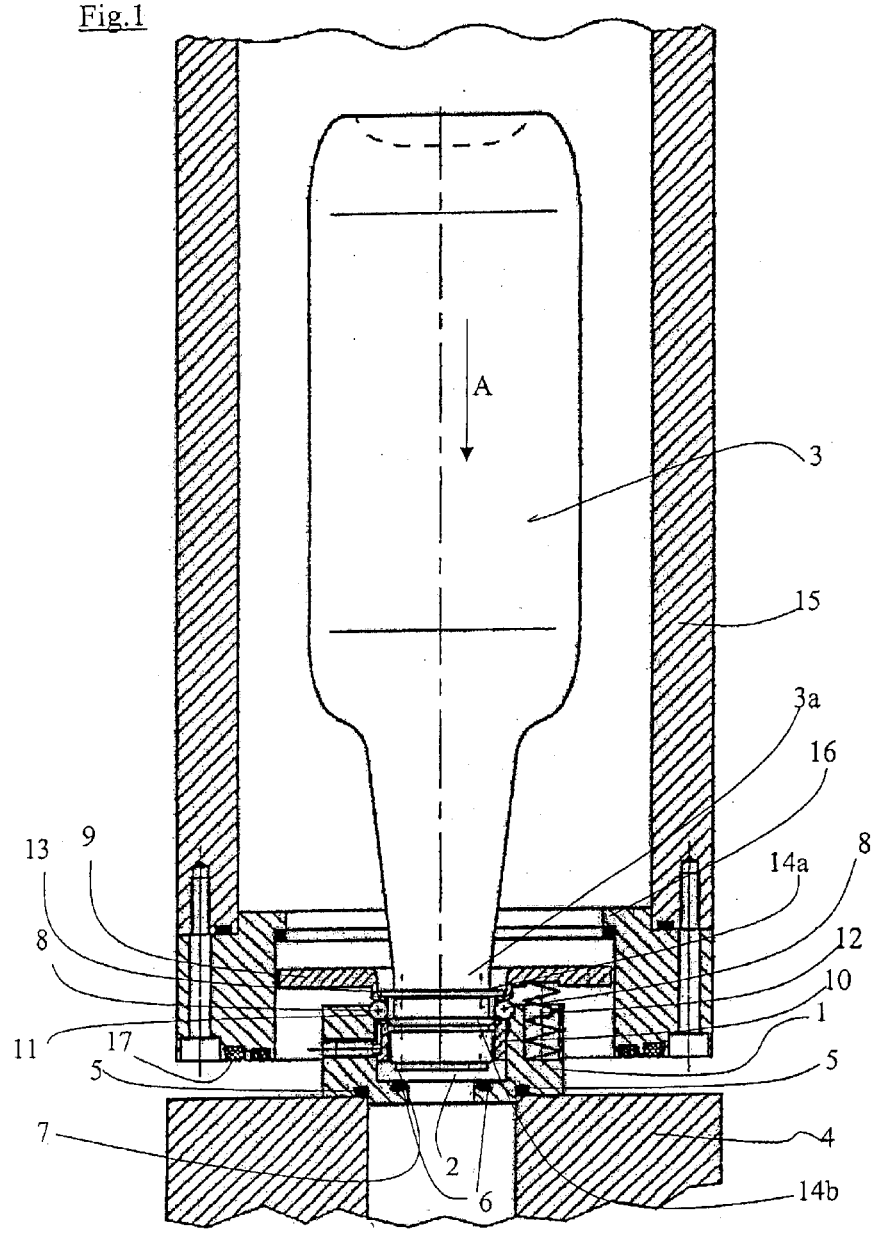

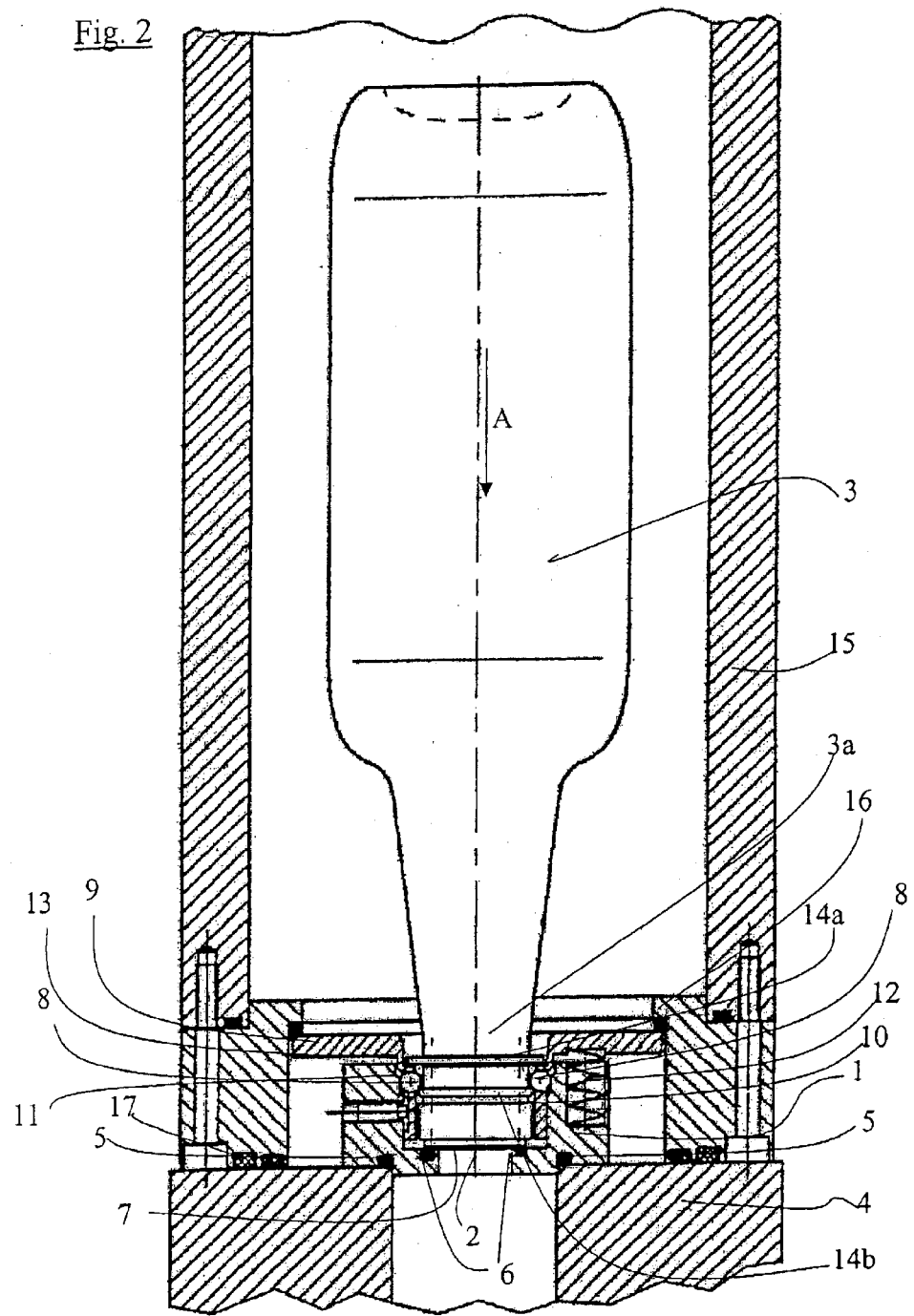

DEVICE FOR HOLDING AND VACUUM-SEALING A CONTAINER HAVING AN OPENING

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

The invention relates to a device for holding and vacuum-sealing a container having an opening, in particular a bottle-like container having a neck which includes a pouring opening.

TECHNICAL FIELD

Devices of this type are used in particular for the internal and/or external coating of containers or hollow bodies, such as for example hollow plastic containers, in the food industry and/or in the medical sector. In these fields, by way of example, hollow plastic containers are internally and/or externally provided with a barrier layer which is extremely resistant to chemical substances and also to temperature changes, has a high resistance to corrosion and a good bonding stability, by means of a deposition process, in particular by means of a plasma impulse chemical vapor deposition process (PICVD).

For this purpose, on a laboratory scale the hollow containers are usually screwed into a holder and sealed at the end of the container and/or pouring opening, so that internal coating becomes possible. After a vacuum-tight bell jar has additionally been fitted over the container, the hollow bodies can be evacuated not only on the inside but also on the outside. Therefore, after vacuum-sealing, the coating operation, which is intended to be carried out on the inner side and/or the outer side can take place.

German laid-open specification DE-A 1 99 57 744 has disclosed a device for sealing the end edge of a container neck. According to this document, to seal the end edge, there is provision for the device to be equipped with a covering ring which has a sealing lip and is made from elastic material, the covering ring being held by a ring holder arranged coaxially with it in such a manner that the end edge of the neck of a container which is to be coated can be pressed against the sealing lip, deforming the latter, in order to form a seal.

However, the laid-open specification does not reveal any means for correspondingly holding the container and drive means for moving the end edge of the container in the direction toward the ring holder, which is arranged in a stationary position, in such a manner that the end edge, before it comes into contact with the covering ring, presses against the sealing lip and deforms the latter in such a manner that the entire end edge is covered by the sealing lip in order to form a vacuum seal.

SUMMARY OF THE INVENTION

It is an object of the invention to develop a holding and vacuum-sealing device of the generic type in such a manner that the operations of holding, sealing and fixing a hollow body can be automated in a simple way, so that the device can be used for an inexpensive industrial coating process, in particular including for coating in a machine with a large number of individual coating stations. The inventive solution to the object of the invention is provided by a device for holding and vacuum-sealing at least one container having an opening, comprising a sealing device for sealing the opening in a defined end state, which device comprises a holder with an introduction region, into which a wall region, which adjoins the opening of the container, can be at least partially introduced, and a cage, which interacts with the holder and holds at least one clamping element in such a manner that, when force is applied to the cage in the direction in which the container is introduced into the defined end state, the clamping element can be guided out of a position in which it substantially releases the introduction region into a position in which it projects into the introduction region. The object of the invention is also achieved by an installation for vacuum coating the interior and/or exterior surfaces of at least one container, in particular of a bottle-like container, which comprises at least one device according to the invention.

Advantageous or preferred embodiments form the subject matter of the devices according to the invention.

Therefore, according to the invention, it is provided for the device for holding and vacuum-sealing having a sealing device for sealing the opening of a container in a defined end state to be designed in such a manner that it includes a holder with an introduction region, into which the wall region of the container, which adjoins the opening, can be at least partially introduced, and a cage which interacts with the holder, the cage holding at least one clamping element which, when force is applied to the cage in the direction in which the container is introduced into the defined end state, can be moved out of a position in which it substantially releases the introduction region into a position in which it projects into the introduction region.

According to the invention only one movement operation is required in order to hold, fix and seal a container. The fixing is in this case effected by the clamping element which interacts with the holder, the opening, in parallel, being simultaneously sealed in the introduced end state of the container, i.e. in the fixed state. Therefore, the device according to the invention ensures a holding and sealing operation, which can be automated in a very simple way along just one axis, which corresponds to the direction of introduction of the container. There is therefore no need for complex rotary movements, for example for screwing the container and/or drive movements in a direction which is transverse with respect to the direction of introduction, for example in order to fix the container.

In a practical refinement, the device is designed to hold and vacuum-seal at least one container with a wall region which adjoins the opening and is designed in the form of a neck.

In a development of the device according to the invention, furthermore, it is provided that the cage comprises a carriage that can be displaced along the direction of introduction and a guide surface arranged in a stationary position, between which the at least one clamping element is held. As a result, in a simple manner, it is possible to ensure defined guidance of the at least one clamping element which is not prone to faults.

To ensure that the container is introduced without becoming jammed, the clamping element provided is in particular a ball. Furthermore, in a particular refinement, there is a multiplicity of clamping elements which are spaced apart from one another, in particular arranged around the introduction region, and which can each be introduced into the introduction region in a direction which is transverse with respect to the direction of introduction of the container, in order to ensure significantly improved introduction of the container neck and defined fixing of the container.

According to a refinement, in particular in order to reduce the number of components required to produce the device according to the invention and therefore also to reduce costs, there is provision for the surface, in order to guide the at least one clamping element, to be designed as part of a holding body which delimits the introduction region, such as in particular an annular or cylindrical body which delimits the introduction region.

In a simple and expedient refinement, furthermore, the invention provides for the guide surface to effect a narrowing of the introduction region in the direction of introduction.

To securely fix the container in the introduced position, furthermore, it is proposed for the cage means and/or the clamping element to be designed in such a manner that the clamping element can be latched into grooves and/or projections, formed on the neck of the container, in particular into an external screw thread. To evacuate the interior of the container, the introduction region is furthermore designed to hold a vacuum system, which can be introduced from the rear side, in a manner, which is expedient in terms of the direction of introduction.

The device according to the invention also comprises a driver, which is assigned to the container to be introduced, for applying force to the cage when the container is moving in the direction of introduction. This ensures that the fixing and sealing operation is controlled directly by means of the control of the movement of the container itself.

In a particular refinement according to the invention, for this purpose, it is provided, that the cage comprises a driver, which at least partially surrounds the introduction region, in such a manner that the application of force can be effected by means of an annular shoulder formed on the neck of the container and/or a projection formed on the neck.

In order, furthermore, to coat the outer surface of the container, it is also provided, in a practical refinement, for the device according to the invention to be designed with a vacuum bell jar, which can be fitted over the container, which can be introduced, in order also to evacuate the space outside the container.

For this purpose, it is expediently also proposed for the cage to be allocated a driver which is assigned to the bell jar and/or guide elements which can be introduced from the outside and which applies the force to the cage in order to guide the clamping element when the bell jar and/or guide elements which can be introduced from the outside are moving in the direction of introduction.

To ensure a rapid feed of containers which are to be introduced and therefore a substantially disruption-free exchange of containers which are to be introduced in succession for industrial applications, it is furthermore provided, in a practical refinement, for the cage to be held under a prestress which is directed oppositely to the direction of introduction. Particularly when balls are used as the clamping and/or blocking elements, this measure effectively ensures that simple removal of the container neck is achieved when the container is moved out of the introduction region in the opposite direction to the direction of introduction.

Furthermore, the invention proposes an installation for the vacuum-coating of the interior and/or exterior surfaces of at least one container, having at least one holding and vacuum-sealing device. On account of the holding and sealing device according to the invention, which only requires an extremely small overall height, any disturbances with regard to the plasma-generating microwave field in a vacuum-coating installation of this type are substantially minimized.

The vacuum-coating installation in this case comprises a multiplicity of the devices according to the invention, in order in particular for mass production to provide a multiplicity of individual coating stations in parallel. A vacuum bell jar, which is required for the external coating of the hollow bodies, is in this case also designed in such a manner that it can be fitted over all the coating stations together.

BRIEF DESCRIPTION OF THE DRAWINGS

The invention is described in more detail below, by way of example, on the basis of a preferred embodiment of the holding and sealing device according to the invention and with reference to the appended drawings, in which:

FIG. 1 shows a vertical section through parts of a holding and sealing device according to the invention, with a bottle which has already been inserted into the device but has not yet been fixed and sealed, and FIG. 2 shows a vertical section through the device shown in FIG. 1 but with the bottle in the introduced, i.e. fixed and sealed, end state.

DETAILED DESCRIPTION OF THE INVENTION

The following text refers first of all to FIG. 1, which shows a vertical section through a holding and sealing device according to the invention with a hollow body 3, which has not yet been fully introduced into its end state.

The device is integrated in a coating installation for the internal and/or external coating, in particular by vapor deposition, of in particular plastic hollow containers used in the food industry and/or in the medical sector.

The device comprises a substantially cylindrical holding body 1. To hold a wall region 3a, which is designed in the form of a neck and adjoins a pouring opening, of the hollow body 3 which is to be coated, the holding body 1 has, in the axial direction, as an introduction region, a holding opening 2, into which the hollow body 3 can be introduced in the direction indicated by arrow A. In the region of contact, the holding body 1 is hermetically sealed by a rear region 4 (not shown in more detail) of the device with sealing elements 5.

In the fully introduced position (FIG. 2) of the hollow body 3, which in the present case is a plastic bottle which is to be coated by means of a PICVD process, therefore, a vacuum system (not shown) for evacuating the container can be coupled up through the holding opening 2 from the rear region 4, in the opposite direction to the direction of introduction of the hollow body 3, for the purpose of internal coating of the hollow body 3.

To completely seal the region which is to be evacuated with respect to the environment, the holding body 1 also has a sealing device 6, for example in the form of a sealing ring, an end edge 7, which defines the pouring opening of the neck 3a, in the introduced end state, as can be seen from FIG. 2, pressing onto the sealing device 6, so that as a result the pouring opening is sealed.

The device also comprises at least one clamping element 8. However, in practice the present exemplary embodiment comprises a multiplicity of clamping elements 8 of this type, two of which can be seen in the sectional illustration. Furthermore, the clamping elements are designed as balls in order to effectively prevent jamming of the neck 3a, which is to be introduced.

The balls 8 are trapped moveably in a cage, with movement in the radially outward and radially inward direction in particular being ensured. According to the basic exemplary embodiment, for this purpose the device has a carriage 9, which is of annular design and has a radially formed guide edge 10, which extends in the direction of introduction into the holding opening 2 and substantially bears against the inner surface of the holding opening 2. In the region of the clamping elements 8, the carriage 9 has openings, which are formed in the guide edge 10 and each comprise a diameter, which is slightly smaller than the balls 8. Furthermore, the holding body has shoulders 11 which are machined into its inner side, which defines the holding opening 2, in such a manner that the clamping elements 8 are therefore trapped between the shoulders 11 and the guide edge 10, it being possible for the balls 8 to move radially into the holding opening 2 via the openings formed in the guide edge 10 until a maximum position is reached. In this case, the shoulders 11 which are machined as a guide surface preferably narrow the introduction region 2 in the direction of introduction, so that the desired movement of the balls 8 is additionally assisted. The carriage 9 bears against a compression spring 12, which is held in the holding body 1.

The neck 3a of the hollow body 3 usually has radially encircling rings 14a and 14b for securing a lid, such as for example a crown cap or the like. As an alternative to the rings 14a and 14b, however, the neck 3a may also, by way of example, have an external screw thread or undercuts for securing a lid.

It should be noted that the holding and sealing device might also have a number of introduction regions or holding openings 2 for simultaneous introduction of a multiplicity of containers.

In particular for the external vacuum-sealing of the hollow body 3, furthermore, the device comprises a bell jar 15, which is fitted over the container 3. In practice, the bell jar 15 has radially inwardly directed shoulders 16, so that when the bell jar 15 is being guided in the direction of introduction A, the shoulders 16 come to bear against the carriage 9, as can be seen from FIG. 2, and accordingly carry it along in the direction of introduction A. If, as in the present exemplary embodiment, the balls 8 engage between the rings 14a and 14b, the container 3 is as a result simultaneously pulled in direction A until the end edge 7 of the container 3 comes to bear in a sealing manner against the sealing device 6 (FIG. 2). In other words, therefore, the bottle is fixed and sealed as a result of the bell jar 15 being lowered, since the balls 8 are moved radially into the holding opening 2 by means of the cage described above, surrounding the neck 3a between the rings 14a and 14b, so that the container neck 3 is fixed in place.

In addition, the bell jar 15 has sealing elements 17 for vacuum-sealing purposes. Furthermore, the coating system can expediently be guided into the interior of the bell jar 15 via feed lines (not shown) within a vacuum-coating installation.

Consequently, overall, the device according to the invention is of very low height, with the result that there is only slight disruption to the plasma-generating microwave field in a vacuum-coating installation. Furthermore, the use of balls as clamping elements ensures that the hollow body 3, which is to be coated, can be introduced into the holding device and removed again without becoming jammed.

A vacuum-coating installation of this type advantageously has a number of holding and vacuum-coating devices according to the invention, for example arranged in the form of a row, so that automatic feeding and consequently coating of a multiplicity of hollow bodies can be carried out in parallel. A vacuum bell jar, which is required for the external coating of the hollow bodies, can in this case furthermore preferably be designed in such a manner that it can be fitted over all the individual coating stations together.

Therefore, taking account of the above description, the operation of holding and vacuum-sealing for subsequent internal or external coating of the hollow body or bodies 3, for example by means of a PICVD process based on the present exemplary embodiment, can be summarized as follows.

The hollow plastic body 3 is fitted into the introduction region of the holding opening 2 in the direction of introduction A but, as can be seen from FIG. 1, has not yet been fixed and sealed. The hollow plastic body 3 in this case expediently still has a travel of approximately 20 mm. In this position of the hollow body 3, the clamping balls 8 can still move freely and are first of all forced radially outwards by the pouring opening moving in or the neck 3a moving in. The balls 8 can latch between the rings 14a and 14b of the neck region 3. If the carriage 9 is then pressed further in the direction of the holding body 1, so that the edge 10 is pushed further into the holding opening 2, the blocking balls 8 are moved radially inwards, guided by the shoulders 11 which have been machined in the holding body 1, and surround the neck 3a between the rings 14a and 14b. Further driving of the carriage 9, in particular, as described above, by means of the shoulder 16 of the bell jar 15, as can be seen from FIG. 2, causes the end edge 7 of the pouring opening to be pressed onto the sealing means 6 and thereby sealed.

In the present exemplary embodiment, i.e. when the bell jar 15 is being used, the driving of the carriage 9 counter to the spring pressure generated by the compression spring 12 is controlled directly by the bell jar 15 moving in the direction of introduction, the balls 8 which engage between the rings 14a and 14b driving the plastic bottle 3 along, and as a result the end edge 7 being pressed onto the sealing means 6.

However, in an alternative embodiment, there is also provision for the carriage 9 to be driven and therefore the clamping and sealing operation to be carried out by means of rods, which are guided into the device from the outside and are sealed appropriately. In this case, the rods are expediently actuated by pneumatic cylinders or mechanical control cams.

We claim:

1. A device for holding and vacuum-sealing at least one container (3) having an opening, comprising
a sealing device (6) for sealing the opening in a defined end state, which device comprises
a holder with an introduction region (2), into which a wall region (3a), which adjoins the opening of the container (3) is at least partially introduced, and
a cage (9, 10, 11), which interacts with the holder and holds at least one clamping element (8) in such a manner that, when force is applied to the cage (9, 10, 11) in the direction in which the container (3) is introduced into the defined end state, the clamping element (8) can be guided out of a position in which it substantially releases the introduction region (2) into a position in which it projects into the introduction region (2).

2. The device as claimed in claim 1, which holds and vacuum-seals at least one container (3) with a wall region (3a) which adjoins the opening and is in the form of a neck.

3. The device as claimed in claim 1, wherein the cage (9, 10, 11) also comprises a carriage (9) which is displaced along the direction of introduction and a guide surface (11) arranged in a fixed position, between which the at least one clamping element (8) is held.

4. The device as claimed in claim 1, wherein the at least one clamping element comprises a ball (8).

5. The device as claimed in claim 1, wherein, the cage (9, 10, 11) holds a multiplicity of clamping elements (8) which are spaced apart from one another and are introduced into the introduction region (2) in a direction which is transverse with respect to the direction of introduction.

6. The device as claimed in claim 1, wherein, the cage (9, 10, 11), in order to guide the at least one clamping element (8), has a guide surface (11) which is part of a holding body (1) which delimits the introduction region (2).

7. The device as claimed in claim 6, wherein the guide surface comprises a holding ring or holding cylinder.

8. The device as claimed in claim 1, wherein the cage (9, 10, 11), in order to guide the at least one clamping element (8), has a guide surface (11) which effects a narrowing of the introduction region (2) in the direction of introduction.

9. The device as claimed in claim 1, wherein the cage (9, 10, 11) and/or the clamping element is designed in such a manner that the clamping element (8) is latched into grooves and/or projections (14a, 14b) formed on the neck (3a) of the container (3), which is to be introduced.

10. The device as claimed in claim 1, wherein the introduction region (2) is designed to hold a vacuum system, which can be introduced from the rear side with respect to the direction of introduction.

11. The device as claimed in claim 1, which also comprises a driver (16), which is assigned to the container (3), for applying force to the cage (9, 10, 11) when the container (3) is moving in the direction of introduction.

12. The device as claimed in claim 1, which comprises a vacuum bell jar (15) that can be fitted from the outside over the container.

13. The device as claimed in claim 1, which also comprises a driver (16), which is assigned to a vacuum bell jar (15) which is fitted over the introducible container (13) from the outside and/or to guide elements which are introduced from the outside, for applying force to the cage (9, 10, 11) when the vacuum bell jar (15) and/or guide elements which are introduced from the outside are moving in the direction of introduction.

14. The device as claimed in claim 1, wherein the cage (9, 10, 11) is held under a prestress that is directed oppositely from the direction of introduction.

15. An installation for the vacuum-coating of the interior and/or exterior surfaces of at least one container (3), which comprises at least one device as claimed in claim 1.

16. The installation according to claim 15, in which the at least one container comprises a bottle.

* * * * *